United States Patent
Celler

(10) Patent No.: US 9,761,493 B2
(45) Date of Patent: Sep. 12, 2017

(54) THIN EPITAXIAL SILICON CARBIDE WAFER FABRICATION

(71) Applicant: RUTGERS, THE STATE UNIVERSITY OF NEW JERSEY, New Brunswick, NJ (US)

(72) Inventor: George K. Celler, Summit, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 88 days.

(21) Appl. No.: 14/163,432

(22) Filed: Jan. 24, 2014

(65) Prior Publication Data

US 2015/0214040 A1    Jul. 30, 2015

(51) Int. Cl.
  *H01L 21/78* (2006.01)
  *H01L 27/12* (2006.01)
  *H01L 21/762* (2006.01)
  *H01L 21/02* (2006.01)

(52) U.S. Cl.
  CPC .... *H01L 21/7813* (2013.01); *H01L 21/76254* (2013.01); *H01L 27/1266* (2013.01); *H01L 21/02378* (2013.01); *H01L 21/02529* (2013.01); *H01L 21/02658* (2013.01)

(58) Field of Classification Search
  CPC ........... H01L 21/76254; H01L 27/1214; H01L 27/1266
  See application file for complete search history.

(56) References Cited

U.S. PATENT DOCUMENTS

| | | | |
|---|---|---|---|
| 8,507,361 B2 | 8/2013 | Letertre et al. | |
| 2006/0241726 A1* | 10/2006 | Whitehurst | ..................... 607/86 |
| 2010/0133550 A1* | 6/2010 | Zhang et al. | .................... 257/77 |
| 2011/0042686 A1* | 2/2011 | Han et al. | ........................ 257/77 |
| 2012/0258554 A1 | 10/2012 | Belle | |
| 2013/0089968 A1* | 4/2013 | Usenko | ............. H01L 21/02238 438/458 |
| 2014/0038329 A1* | 2/2014 | Petti | ................... H01L 21/76254 438/33 |
| 2014/0264374 A1* | 9/2014 | Hecht et al. | .................... 257/77 |

OTHER PUBLICATIONS

Sun et al., "Epitaxial Growth of SiC on Complex Substrates," Journal of Crystal Growth, 227-228 (2001), pp. 811-815.*

* cited by examiner

*Primary Examiner* — Lex Malsawma
*Assistant Examiner* — Xia Cross
(74) *Attorney, Agent, or Firm* — Talem IP Law, LLP

(57) ABSTRACT

Techniques for fabricating thin epitaxial SiC device wafers are described. A bulk SiC wafer is used to provide a seed layer of a thin layer of SiC for epitaxially growing SiC. The seed layer is exfoliated from the bulk SiC after bonding the bulk SiC to a handle substrate. The bulk SiC wafer from which the thin layer of SiC is exfoliated may be re-used in fabricating subsequent thin film epitaxial SiC wafers. After growing epitaxial SiC from the seed layer on the handle substrate, devices may be fabricated in the epitaxial SiC and the handle substrate can be removed. The handle substrate can be re-used in fabricating subsequent thin film epitaxial SiC wafers. The epitaxial SiC can be cut into dies and packaged as an SiC chip or bonded to another substrate, such as a silicon substrate with devices formed thereon.

21 Claims, 11 Drawing Sheets

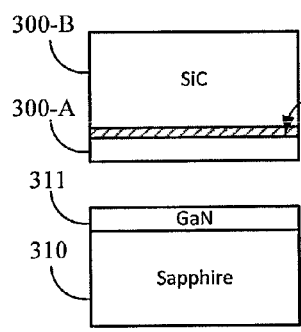 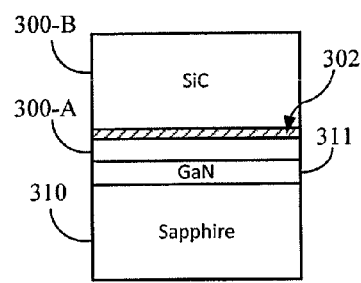 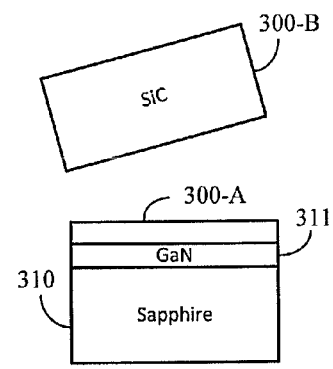
FIG. 3A FIG. 3B FIG. 3C
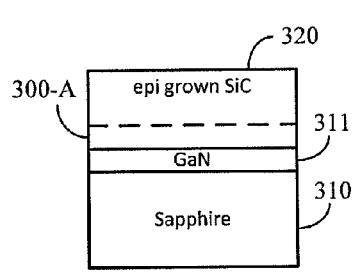 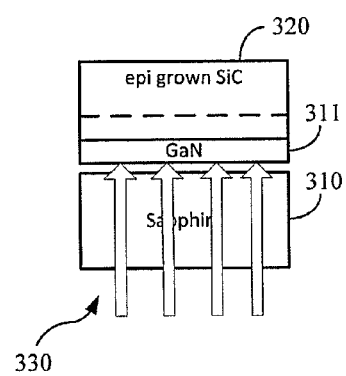 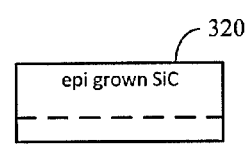
FIG. 3D FIG. 3E FIG. 3F

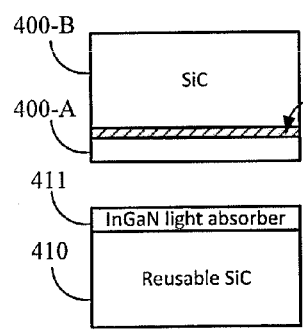
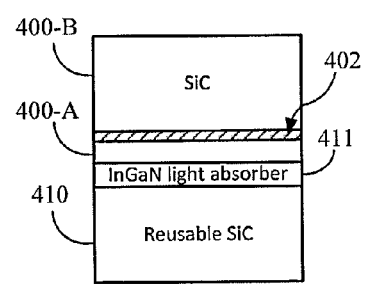
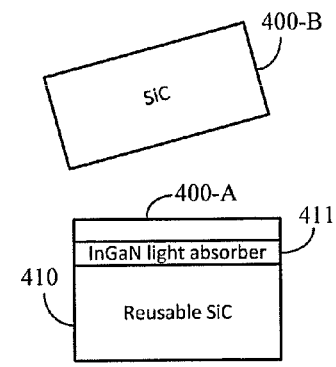
FIG. 4A          FIG. 4B          FIG. 4C
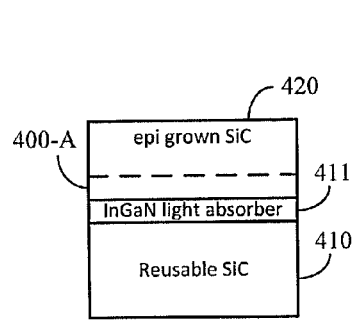
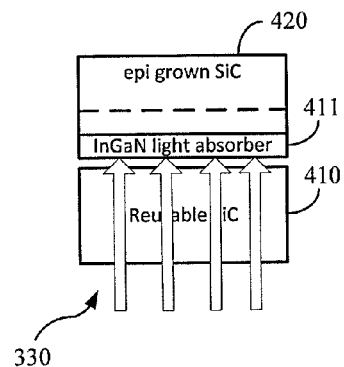
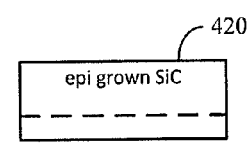
FIG. 4D          FIG. 4E          FIG. 4F

THIN EPITAXIAL SILICON CARBIDE WAFER FABRICATION

BACKGROUND

Silicon carbide (SiC)-based power electronic devices are gaining interest for their high-temperature and high-voltage capabilities. SiC Schottky diodes, SiC insulated gate bipolar transistors (IGBTs), SiC junction gate field-effect transistors (JFETs), and SiC metal oxide semiconductor field effect transistors (MOSFETs) are some examples of popular SiC devices. Unfortunately, device production continues to be a challenge due to the expense of materials, partly due to the small wafer sizes currently available for fabricating the SiC devices.

BRIEF SUMMARY

Methods of fabricating SiC power and high voltage devices are described. The techniques described herein can result in reduction to device cost and, in some cases, can result in a better performance compared to current fabrication techniques for silicon carbide devices.

SiC devices may be fabricated on SiC formed from an originating SiC wafer that is bonded to a handle wafer and exfoliated to provide a seed layer for SiC epitaxial growth.

The techniques described herein are also suitable for integrating SiC power devices with silicon complementary metal oxide semiconductor (CMOS). In one such implementation, devices (e.g., analog, digital, and/or mixed signal circuits) can be separately fabricated on a Si wafer. The Si wafer having the devices formed thereon and a SiC structure can be bonded together. The bonding may be carried out after or immediately before devices are formed in the SiC layer epitaxially grown on the handle substrate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIGS. 3A-3F show representational diagrams of a thin epitaxial silicon carbide wafer fabrication process using a GaN/Sapphire substrate.

FIGS. 4A-4F show representational diagrams of a thin epitaxial silicon carbide wafer fabrication process using an InGaN/SiC substrate.

DETAILED DISCLOSURE

Methods of fabricating SiC power and high voltage devices are described. The techniques described herein can result in reduction to device cost and, in some cases, can result in a better performance compared to current fabrication techniques for silicon carbide devices.

The bulk SiC wafer is often an expensive component of the SiC device fabrication process. Indeed, in some cases, the bulk material may be 50% of the total device cost. There are a number of ways (that may be used alone or together) to lower the cost of SiC power devices. One way is to improve and increase device yield. Another way is to reduce the size of the devices, fabricating higher performance devices (e.g., reducing Ron). Yet another way is to use larger diameter wafers. At the heart of some of these approaches is an attempt to get more devices out of a costly material.

Certain embodiments are directed to minimize the amount of bulk SiC wafer usage per chip. Through the techniques described herein, bulk SiC usage in device fabrication can be minimized, thereby reducing the cost of SiC devices. In addition, vertical SiC power devices can be fabricated and on-resistance (Ron) of the devices can be reduced by growing thin all-epitaxial wafers (and thereby on-current increased).

One of the approaches described herein to reduce the amount of bulk SiC per chip involves epitaxial growth of SiC. The SiC devices can be fabricated while using a minimal amount of SiC crystal from the bulk. For example, the SiC bulk wafer can "donate" a thin seed SiC layer multiple times, resulting in an overall reduction in the material cost per device. In addition, epitaxial growth of SiC is relatively inexpensive as compared to bulk SiC. Therefore, the ability to re-use the bulk material and rely on epitaxial growth of the SiC can drastically reduce the cost of fabricating the device. By using a thin device wafer, Ron can be minimized. Thus, thin device wafers can be generated through epitaxial SiC instead of requiring wafer thinning by grinding to improve device performance.

Figure 1:
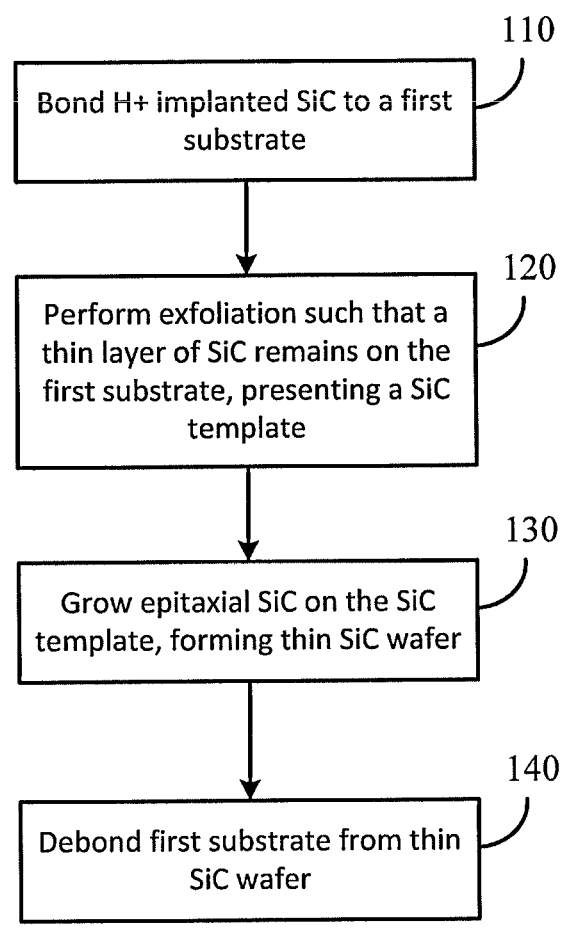
FIG. 1 shows a process flow diagram illustrating thin epitaxial silicon carbide wafer fabrication.

FIG. 1 shows a process flow diagram illustrating thin epitaxial silicon carbide wafer fabrication. A layer of single crystalline SiC (e.g., between 1 and 10 μm thick) can be transferred to a temporary substrate. For example, a thin film SiC wafer can be formed by bonding a hydrogen ion implanted bulk SiC wafer to a first substrate (110), and then performing an "exfoliation" process such that a thin layer of SiC remains on the first substrate (120).

This first substrate may also be referred to as a temporary substrate or a handle substrate (or wafer) because of its function to act as a temporary handle (holder or processing apparatus contact point) for facilitating processing.

The temporary substrate is selected for its ability to bond to the bulk SiC wafer, be able to withstand the temperatures used for processing of SiC (including but not limited to forming devices and growing epitaxial layers), be removed (debonded) at a suitable time (without damaging the SiC structure), and, if needed, be used to attach the SiC layer to a different substrate. The attachment to a different substrate may be carried out before or after debonding from the first (temporary) substrate. One or more additional material layers may be included with the handle wafer to provide suitable thermal expansion coefficients, particularly with respect to matching the thermal expansion coefficient of SiC. In addition, a material layer may be included to facilitate bonding.

The remaining thin layer of SiC on the first substrate presents a SiC template (or seed layer) on which to epitaxially grow SiC (130). According to one implementation, a thick (compared to the seed layer) p-type SiC can be epitaxially grown on a thin seed layer of SiC, which can also be p or p+ by means of implantation. In another implementation, n-type SiC can be epitaxially grown on the thin seed layer, which may be implanted with n-type dopants. In some cases, vertical devices can be fabricated using both n-type and p-type epitaxial layers, and the epitaxially grown SiC layer can be grown of one type for a particular thickness and another type for a particular thickness from a same seed layer or the doped epitaxial layers may be fabricated in separate bonding/epitaxial growth processes.

A thin (compared to a bulk SiC wafer) film epitaxial SiC wafer is formed from the epitaxially grown SiC (and seed layer). The SiC layer can be a relatively thin (compared to bulk wafer) SiC layer (50-150 um thick), the size of which is beneficial for vertical devices (less "ON" resistance).

Removing the first substrate (by debonding) leaves the thin film epitaxial SiC wafer (140). SiC devices may be formed in or on the thin film epitaxial SiC wafer before or after debonding of the first substrate.

Advantageously, the bulk SiC wafer from which the thin layer of SiC is exfoliated may be re-used in fabricating subsequent thin film epitaxial SiC wafers.

It should be understood that in some embodiments, the SiC wafer from which the thin layer of SiC is exfoliated may be a bulk SiC wafer with an epitaxial SiC film. Here, the epitaxial SiC film portion on the bulk SiC wafer may be exfoliated to provide the thin layer of SiC on the first substrate or other substrates. More epitaxial SiC can be grown on the bulk SiC wafer to bring the SiC wafer back to full thickness (for use in the processes again).

FIGS. 2A-2I show representational diagrams of an example thin epitaxial silicon carbide wafer fabrication process.

Figure 2A:
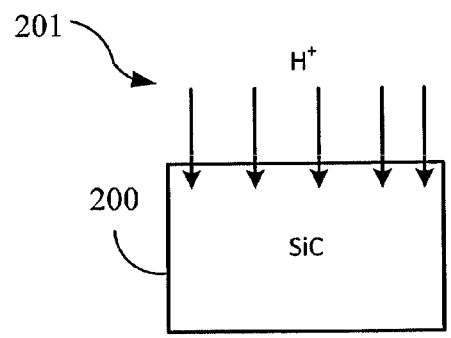
FIGS. 2A-2I show representational diagrams of an example thin epitaxial silicon carbide wafer fabrication process.
Figure 2B:
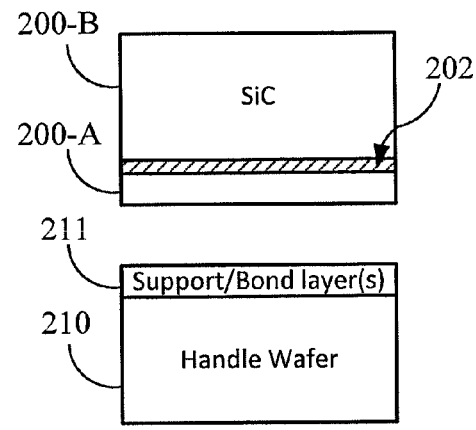

Referring to FIGS. 2A and 2B, a bulk SiC wafer 200 may be implanted with hydrogen ions 201 (or other noble gas ions) such as commonly performed for bonding and wafer splitting (also referred to as "ion-cutting" or "exfoliation") techniques. The hydrogen ions form a hydrogen-rich zone 202 that, when heated, can easily cause the bulk to split across the wafer (forming donated portion 200-A and remaining bulk portion 200-B). In this manner, the bulk SiC wafer 200 can be used and re-used as a seed layer for SiC devices.

Referring to FIG. 2B, a handle substrate 210 can be prepared with a support and/or bond layer 211.

The temporary substrate of the handle substrate 210 and support/bond layer(s) 211 are selected with considerations including, but not limited to, one or more of the materials' ability for bonding to SiC, withstanding particular temperatures used in the SiC exfoliation process and in subsequent device processing, and with characteristics enabling subsequent removal without damaging the SiC structure.

A bond layer can be selected to enable hydrophilic bonding between the handle wafer and the SiC wafer. For example, a dielectric may be used that is formed of an oxide or nitride including, but not limited to silicon dioxide, silicon nitride, sapphire ($Al_2O_3$), or boron nitride.

The handle wafer material(s) (handle and support layers(s)) can be selected for suitable thermal expansion matching as well as the ease of removal. In some cases, the handle substrate 210 can be a sapphire substrate and the support/bond layer(s) 211 can include GaN (see FIGS. 3A-3E) as well as a dielectric layer that directly contacts the SiC. Sapphire and GaN are suitable materials because they can easily withstand the high temperatures (e.g., 1600° C.) used in the subsequent epitaxial SiC growth. In some cases, the handle substrate 210 can be a second SiC substrate and the support/bond layers 211 can include InGaN (see FIGS. 4A-4E) as well as a dielectric layer for bonding. Examples of materials for the dielectric layer include, but are not limited to, $SiO_2$, SiN, $Al_2O_3$, and BN.

Figure 2C:
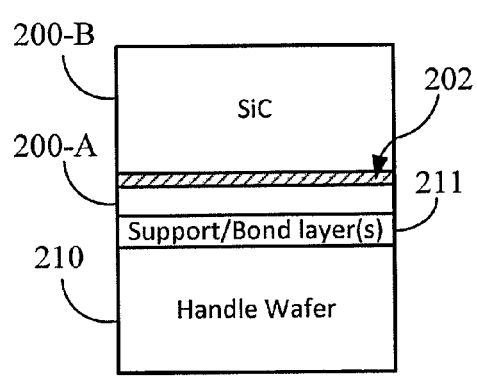
Figure 2D:
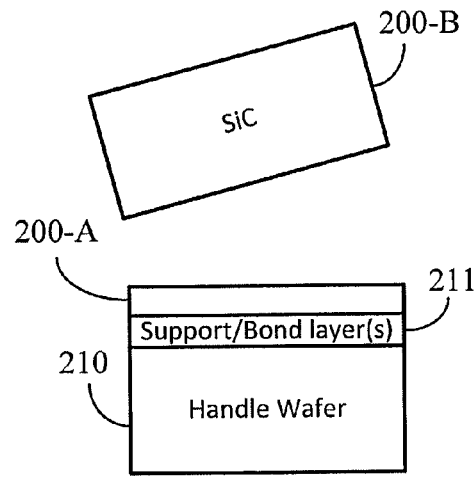

As illustrated in FIG. 2C, the H+ implanted SiC wafer (with elements 200-A, 202, 200-B) can be bonded to the handle substrate 210. Then, the SiC wafer can be ion-split such that the thin bonded portion 200-A of the SiC wafer remains on the handle substrate 210 as illustrated in FIG. 2D. This process may be referred to as exfoliation. The exfoliation process can include low temperature bonding followed by heating the stack to between about 850° C. and about 950° C., resulting with a SiC template (of the bonded donated portion 200-A) on the handle substrate 210.

Figure 2E:
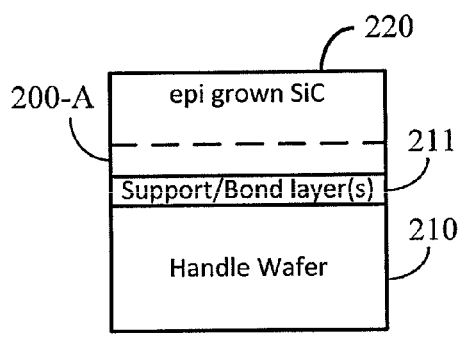

Referring to FIG. 2E, epitaxial SiC 220 can be grown on the SiC template 200-A (or seed layer). A surface smoothing process or other treatment may be performed on the thin SiC layer 200-A before growing the epitaxial layer. In addition, in some implementations device features may be formed. For example, implantation, etching and other steps used in fabricating SiC device structures may be carried out once the thin layer of SiC 200-A is transferred to the handle substrate 210.

Figure 2F:
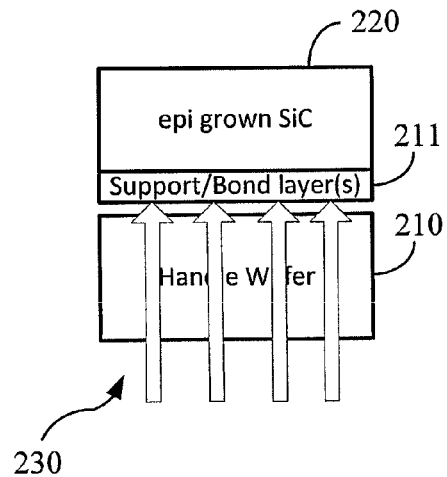

Referring to FIG. 2F, the handle wafer 210 can be removed. For example, laser liftoff 230 can be used to remove GaN from a sapphire wafer (i.e., an opaque layer from the handle substrate).

Figure 2G:
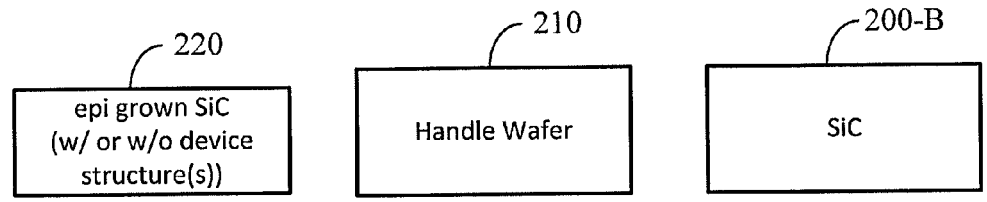

Referring to FIG. 2G, support/bond layer(s), such as GaN, can be etched away, leaving three wafers: the thin epitaxial SiC wafer 220 that may include device structures; the handle wafer 210, and the remaining bulk wafer 200-B. Once the residual opaque layer 211 (e.g., GaN layer) is removed from the bonded side of the epitaxially grown SiC wafer 220, this wafer can be referred to as the device wafer since it is this portion that is used for the SiC device. The handle wafer 210 may be cleaned to enable growth of another support layer 211. The remaining SiC bulk wafer 200-B may also be processed to enable another donation by exfoliation. The bulk SiC wafer may become thinner by 4 to 10 microns after each use (from the portion donated to seed the device wafer as well as any amount removed due to the repolishing of the wafer). Accordingly, both the SiC bulk wafer 200-B used to form the thin layer of SiC 200-A as well as the handle substrate 210 can be reused to carry out the process of forming the SiC device wafer.

Through the processes described with respect to FIGS. 2A-2G, SiC devices can be fabricated in a thin SiC epitaxial wafer. In FIGS. 2A-2F a process flow of ion implantation into bulk SiC, bonding, exfoliation, epitaxial growth of SiC device layers, and laser liftoff (and etching away of the opaque support/bond layer) is shown that results in a thin wafer of properly doped SiC epitaxial layers that is ready for electronic device fabrication.

The bulk SiC wafer and sapphire substrate are not damaged and can be reused to minimize the cost of the process. Since the bulk SiC wafer can be used many times, the cost of device quality thin epitaxial SiC substrates is greatly reduced, which may lead to much lower cost SiC high power and/or high voltage devices and any other electronic devices and circuits based on SiC.

Figure 2H:
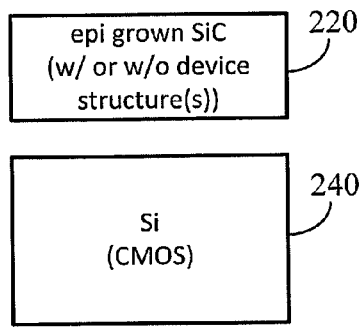
Figure 2I:
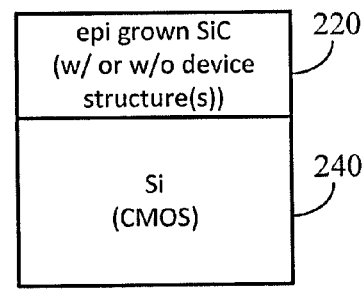

According to a further implementation, as illustrated in FIGS. 2H and 2I, an integrated Si and SiC device can be fabricated. For example, a thin layer of SiC 220 may be bonded to a silicon wafer 240 such that one side of the thin layer of SiC 220 has a Si face and the other side of the thin layer of SiC has a C face. A temporary substrate can be used to fabricate lateral devices on either (or sequentially both) sides. For example, devices can be fabricated on a silicon substrate. Then, a SiC film can be bonded to the Si wafer. In some implementations, devices are fabricated in the thin layer of SiC 220 before the thin layer of SiC 220 is bonded to the Si wafer 240. In another implementation, devices can be fabricated on the Si wafer 240 after the SiC film (with or without devices) 220 is bonded to the Si wafer 240.

In one implementation, the temporary substrate is GaN on sapphire, which enables the use of laser liftoff (laser decomposition of GaN) for debonding the SiC layer from the sapphire.

FIGS. 3A-3F show representational diagrams of a thin epitaxial silicon carbide wafer fabrication process using a GaN/Sapphire substrate.

As illustrated in FIGS. 3A and 3B, a handle wafer can be prepared by forming GaN 311 on a sapphire substrate 310 followed by deposition of a dielectric (not shown). The SiC wafer (donated portion 300-A and bulk portion 300-B separated by a hydrogen-rich zone 302 that, when heated, can easily cause the bulk to split across the wafer) can be bonded (at the donated portion 300-A) to the GaN 311 coated sapphire 310, for example by a low temperature bonding facilitated by the dielectric layer (not shown).

Referring to FIG. 3C, after low temperature bonding of the SiC (at portion 300-A) to the GaN 311 coated sapphire 310, the stack can be heated to a temperature between about 850° C. and about 950° C. or other suitable temperature for performing exfoliation. The remaining bulk portion 300-B can be reused and the steps shown in FIGS. 3A-3C performed again to form another epitaxial SiC film.

The exfoliation leaves a layer of SiC 300-A on the GaN/sapphire substrate. The thickness of the SiC layer 300-A left bonded to the handle wafer can be controlled by the exfoliation implantation energy (and even a chemical mechanical polishing (CMP) process after exfoliation).

After some surface smoothing of the SiC film (which may be carried out via a CMP process), SiC epitaxial layers can be grown as illustrated in FIG. 3D. The SiC epitaxial growth may be carried out by any suitable epitaxial growth process.

After the SiC epitaxial layer(s) 320 are grown, the GaN layer 311 can be removed from the sapphire substrate 310 by laser liftoff 330 as illustrated in FIG. 3E. For example, 3.5 eV radiation of a frequency tripled Q-switched YAG laser can melt and decompose the surface of GaN 311 at the interface with sapphire 310, leading to wafer separation. In one implementation, a KrF 248 nm excimer laser may be used. The sapphire substrate 310 can then be reused in the steps shown in FIGS. 3A-3E to form another epitaxial SiC film.

Referring to FIG. 3F, the residual GaN layer 311 can be removed from the bonded side of the epitaxially grown SiC wafer 320, for example, by an etching process.

Thermal expansion of sapphire is close but not perfectly matched to that of 4H-SiC (one of the polytype structures that may be used for the bulk SiC wafer). An expansion mismatch may lead to wafer bowing during high temperature SiC epitaxial growth. In one implementation, spin-on-glass that is soft at temperatures greater than 1000° C. can be used to reduce stress and bow.

In another implementation, expansion mismatch can be minimized by growing the GaN directly on SiC instead of sapphire. Since the optical bandgaps of GaN and SiC are similar (as opposed to the opaque/transparent optical property of the GaN/sapphire configuration), the convenience of having an opaque layer on a transparent substrate is not available (e.g., making a simple liftoff process not as suitable).

In yet other implementations, other materials may take the place of GaN so that SiC may be used as the third wafer instead of sapphire. Replacing sapphire with SiC as the handle substrate improves thermal expansion matching for epitaxial layer growth of SiC. The bandgap values of some of the materials discussed herein include: GaN—3.4 eV, InN—0.65 eV, 4H-SiC—3.26 eV, sapphire—9 eV. Since the optical bandgap of GaN is greater than that of 4H-SiC, any laser light transmitted through SiC will not be absorbed by GaN.

Therefore, materials can be selected so that any two refractory materials are used. For example, a single or polycrystalline SiC wafer with a thin layer of opaque (smaller bandgap) material on top may be used. The opaque layer can be any layer that can be characterised as smooth and easy to bond to SiC. An opaque layer can be considered to be smooth (for ease of bonding) where the rms (root mean square) roughness of the opaque layer's surface measured in 1×1 micrometer field is less than about 0.2 nm. The opaque layer may be deposited by spin-on, chemical vapour deposition (CVD), magnetron sputtering, or atomic layer deposition (ALD) as some examples. The opaque layer can also be selected for characteristics including the ability to decompose into something with a low melting point (e.g., Ga decomposing from GaN upon laser melting). In such cases, there is no need for a single crystalline film, and amorphous or polycrystalline material may be used as the growth/handle substrate. The opaque material can be polished if needed and then bonded to an H implanted SiC wafer that has electrical doping in the surface layer as required by the eventual device structure.

To facilitate the use of laser lift-off, a light absorbing layer that will decompose and provide liftoff can be InxGa(1−x)N film with suitably chosen ratio of In to Ga, or a thin layer of InN followed by a layer of GaN or AlGaN. Based on the current literature, the melting temperature of GaN is 2518° C. and the melting temperature of InN is 1873° C. Therefore it is anticipated that InxGa(1−x)N will survive to T>1873° C., which is higher than that used for SiC epitaxial growth (about 1650° C.) and implanted dopant activation (1400° C.-1700° C.). Since the light absorbing layer (InGaN or similar) is thin it can deform at elevated temperatures with little effect on stresses in the grown epi layers.

It is possible that vaporization of a highly doped layer at the interface with either sapphire or undoped reusable SiC wafer would be sufficient to liftoff the device wafer. Even if each laser pulse only separates a central region of the irradiated spot, the resulting "honeycomb" of adhering material may be weak enough to break off by applying external force. Therefore, in some cases, the opaque layer may be omitted (and therefore not required to be removed).

In one implementation, the temporary substrate is InGaN on SiC, which also enables the use of laser liftoff for debonding the SiC layer from the temporary SiC wafer.

FIGS. 4A-4F show representational diagrams of a thin epitaxial silicon carbide wafer fabrication process using an InGaN/SiC substrate.

As illustrated in FIGS. 4A and 4B, a handle wafer can be prepared by forming an InGaN light absorbing layer 411 on a reusable SiC substrate 410, optionally followed by deposition of a dielectric (not shown) for use in bonding. The SiC wafer (donated portion 400-A and bulk portion 400-B separated by a hydrogen-rich zone 402 that, when heated, can easily cause the bulk to split across the wafer) can be bonded (at the donated portion 400-A) to the InGaN 411 coated reusable SiC substrate 410, for example by a low temperature bonding facilitated by the dielectric layer (not shown).

Referring to FIG. 4C, after low temperature bonding of the SiC (at portion 400-A) to the InGaN 411 coated reusable SiC substrate 410, the stack can be heated to a temperature between about 850° C. and about 950° C. or other suitable temperature for performing exfoliation. The remaining bulk portion 400-B can be reused and the steps shown in FIGS. 4A-4C performed again to form another epitaxial SiC film.

The exfoliation leaves a layer of SiC 400-A on the InGaN 411 coated reusable SiC substrate 410. The thickness of the SiC layer 400-A left bonded to the handle wafer can be controlled by the exfoliation implantation (and even a CMP process after exfoliation).

After some surface smoothing of the SiC film (which may be carried out via a CMP process), SiC epitaxial layers can be grown as illustrated in FIG. 4D. The SiC epitaxial growth may be carried out by any suitable epitaxial growth process.

After the SiC epitaxial layer(s) 420 are grown, the InGaN layer 411 can be removed from the reusable SiC substrate 410 by laser liftoff 430 as illustrated in FIG. 4E. The reusable SiC substrate 410 can then be reused in the steps shown in FIGS. 4A-4E to form another epitaxial SiC film.

Referring to FIG. 4F, the residual InGaN layer 411 can be removed from the bonded side of the epitaxially grown SiC wafer 420, for example, by an etching process.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

Example Implementations

FIGS. 5-9 show example process flow diagrams for fabricating SiC devices via thin epitaxial silicon carbide wafer fabrication processes; and FIGS. 10A-10D illustrate example implementations for certain steps of a process for fabricating SiC devices via a thin epitaxial silicon carbide wafers fabrication process. It should be understood that these examples should not be construed as limiting and that other permutations and modification are to be included within the spirit and purview of this application.

Figure 5:
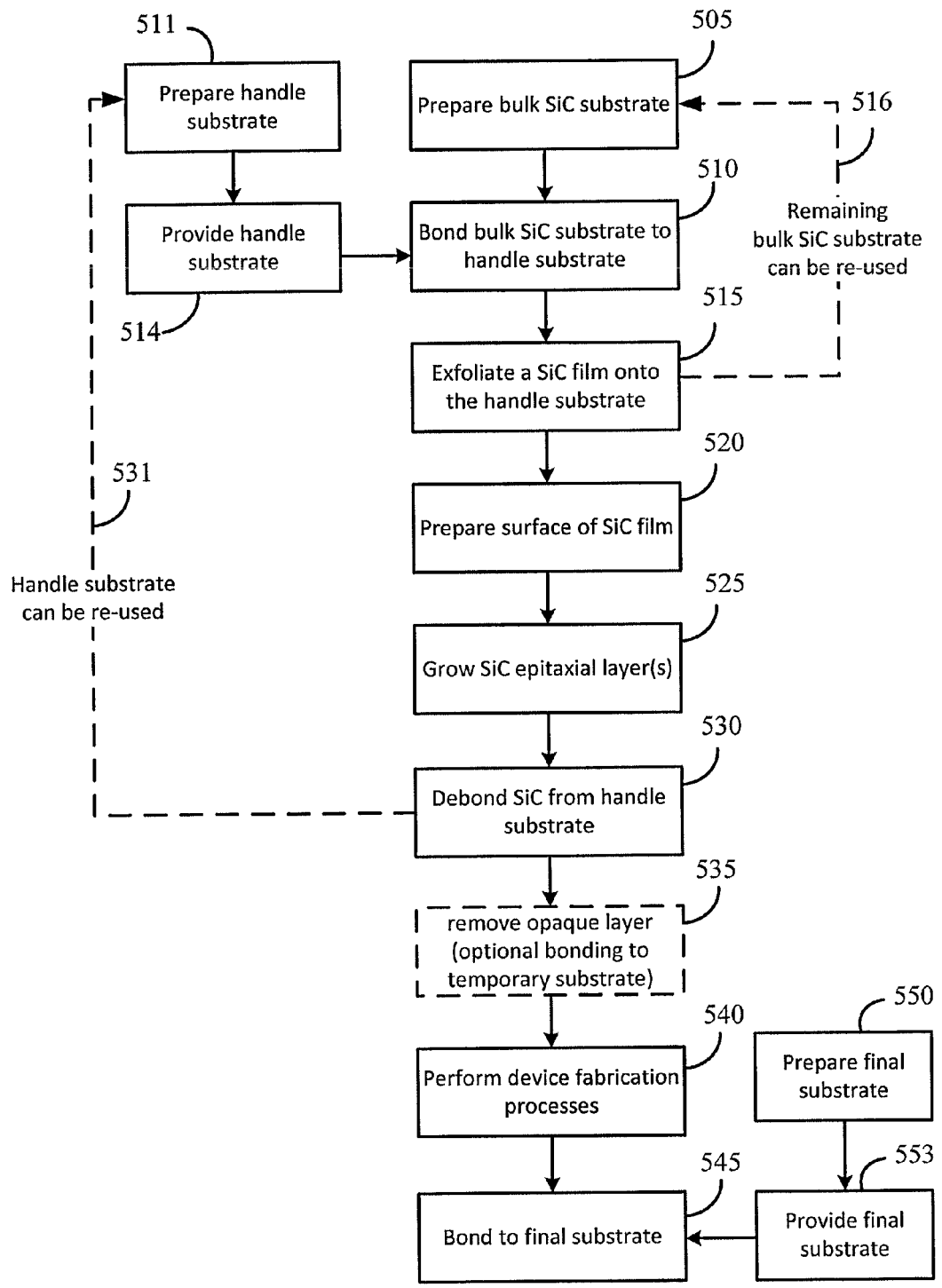
FIG. 5 shows a first process flow diagram for fabricating SiC devices via a thin epitaxial silicon carbide wafer fabrication process.

Referring to FIG. 5, a bulk SiC substrate can be prepared (505). For example, referring to FIG. 10A, when preparing the bulk SiC substrate, a 4H-SiC wafer with a well-polished C-face and some thermal or deposited oxide on its surface can be formed (506). For one example implementation, a thin $SiO_2$ layer may be grown or deposited on the C-face of the SiC wafer. As explained above, $SiO_2$ may not be suitable for certain high temperature processes and therefore in those implementations, other dielectrics may be used so long as the material enables bonding of the SiC to the handle substrate.

In addition, to enable the exfoliation process, H+ ions can be implanted (507). A suitable dose of H+ can be implanted into the SiC wafer to create a hydrogen-rich fragile zone at a desired location within the SiC wafer. For example the H+ ions can be implanted at a dose of $6 \times 10^{-16}$ cm into the C-face of SiC at 180 keV to obtain a fragile zone 1 µm under the surface. It should be understood that the implant energy (and even the dose) can be optimized based on a desired depth of the fragile zone. In some cases, an anticipated material loss during CMP polishing after exfoliation can be a factor in the optimization.

Figure 10A:
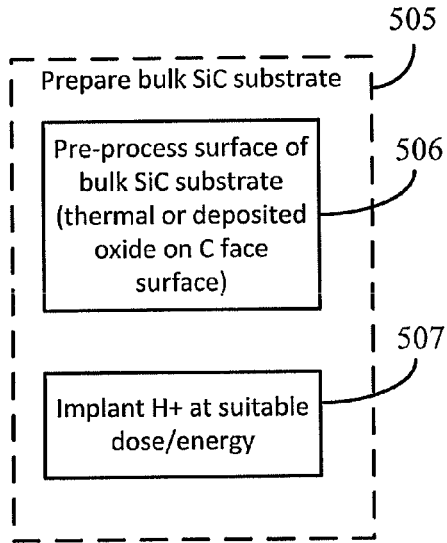
FIGS. 10A-10D illustrate example implementations for certain steps of a process for fabricating SiC devices via a thin epitaxial silicon carbide wafers fabrication process.
Figure 10B:
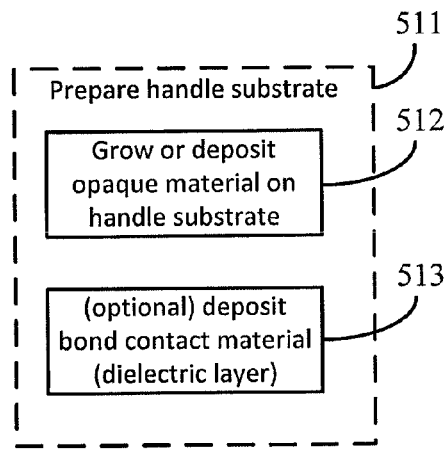

Returning to FIG. 5, the prepared bulk SiC substrate can be bonded to a handle substrate (510). The handle substrate can be prepared for use in the fabrication process (511). Referring to FIG. 10B, the handle substrate can be prepared by growing or depositing opaque material on the handle substrate (512). For example, a thin layer of GaN can be formed on a sapphire wafer with a thin layer of GaN. The GaN layer may be grown on the sapphire wafer through any suitable growth process as part of preparing the handle substrate for use in the fabrication process (510). GaN may be selected because of its ability to be removed via laser liftoff from sapphire; however, other suitable films may be used. In addition, other handle substrates may be selected depending on the application. Optionally, a bond contact material can be deposited on the opaque material (513). For example, a thin layer of $SiO_2$ or other dielectric can be deposited on the GaN layer to facilitate bonding.

Returning again to FIG. 5, once the handle substrate is prepared (514), the handle substrate can be provided for bonding to the prepared bulk SiC substrate (510). According to one implementation, an RCA cleans can be used to remove particulates and contaminants from both wafers and to make the surfaces hydrophilic. This process may be included as part of the preparation of the bulk SiC substrate (505) and the preparation of the handle substrate (511).

During the bonding process (510), the implanted surface of the SiC wafer can be pressed lightly to the GaN surface of sapphire wafer (or other handle wafer composition) to achieve room temperature fusion bonding.

Then, a SiC film can be exfoliated onto the handle substrate (515). The bonded wafer pair is heated for a time period (and at the appropriate temperature) until the two wafers separate. The bonded wafer pair can be heated, for example, within a furnace that is heated by slowly ramping the temperature to about 900° C. (or other temperature between 800° C. and 1100° C., for example, between about 850° C. and about 950° C. inclusive). Through this process, a SiC film can be exfoliated along the implanted H+ fragile zone, resulting in a layer of SiC remaining on the handle substrate with the Si face being exposed (when the C face is bonded to the handle substrate). Thus, there are now again two wafers: one bulk SiC wafer that is thinner by about 1 µm and one Sapphire/GaN/dielectric/1 µm of SiC wafer. The remaining bulk SiC wafer can be reused (516). For example, the bulk SiC wafer can be polished with removal of about 2-3 µm of material. This removes any radiation damage that might have been introduced by H implantation. By performing a polishing or other cleaning process after use, the bulk SiC wafer can be used to produce many more SiC layers (e.g., a micrometer at a time) on sapphire or other temporary handle wafer.

The surface of the exfoliated SiC film on the handle/exfoliated SiC film wafer (e.g., the Sapphire/GaN/dielectric/1 µm of SiC wafer) can be prepared (520). For example, the exfoliated surface of the SiC film can be polished (e.g., via CMP) in order to remove the most damaged subsurface region and to get a smooth surface suitable for epitaxy or any device fabrication steps.

That is, in an example implementation, the thin (~1 μm) SiC layer on sapphire can be polished to obtain a Si-face with epi-ready surface quality. The SiC layer (Si-face exposed) on sapphire becomes a template for epitaxial growth of n and p layers formed for any vertical power device SiC wafer.

Moving to operation 525, epitaxial SiC can be grown on the SiC film. The thickness of the epitaxial layers can be any suitable thickness for device fabrication. For example, the total thickness may be of the order of 30-50 μm.

Once the epitaxial SiC layers are grown, the handle substrate can be debonded (530). For example, laser liftoff can separate GaN from sapphire. Here, the liftoff process is based on decomposition of GaN at the sapphire interface into Ga and N. Gallium is a liquid just above room temperature and this makes layer separation (liftoff) possible.

The handle substrate can then be reused (531). For example, the sapphire wafer can be cleaned and then is ready for growth of GaN for the next fabrication cycle.

Figure 7:
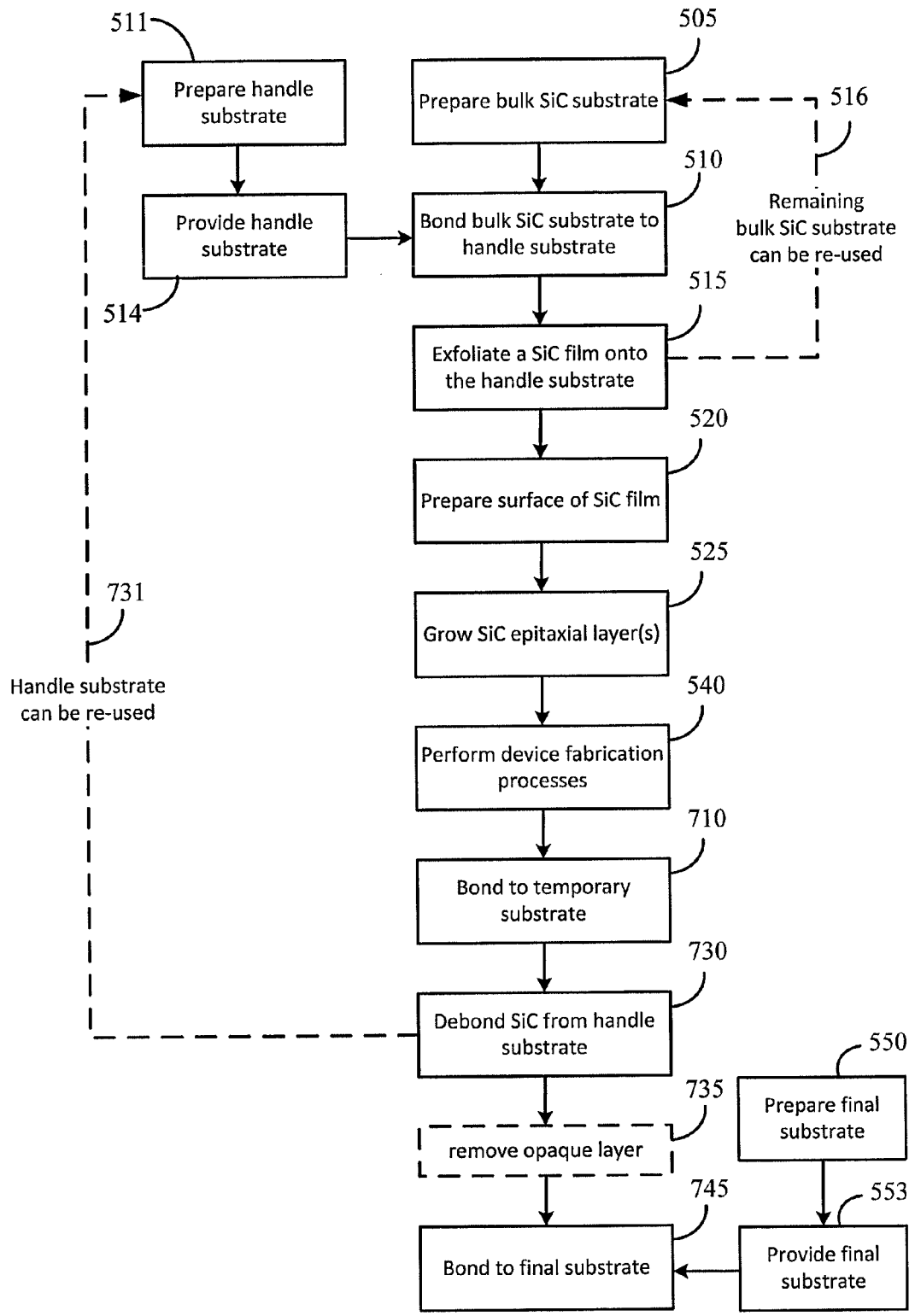
FIG. 7 shows a third process flow diagram for fabricating SiC devices via a thin epitaxial silicon carbide wafer fabrication process.

If necessary for handling purposes, the epitaxial SiC structure can be glued to a temporary substrate before laser liftoff (see also operation 710 in FIG. 7). Since relatively low temperatures are used during laser liftoff, epoxy can be used to bond the temporary substrate to the epitaxial SiC structure.

The temporary substrate may also or alternatively be useful when removing the opaque layer (535). In operation 535, residual GaN (or other remaining materials) can be etched away from the epi-layer thin SiC wafer (and the surface may be cleaned). In addition, the original about 1 μm exfoliated SiC can remain or be etched away depending on device structure requirements.

Figure 10C:
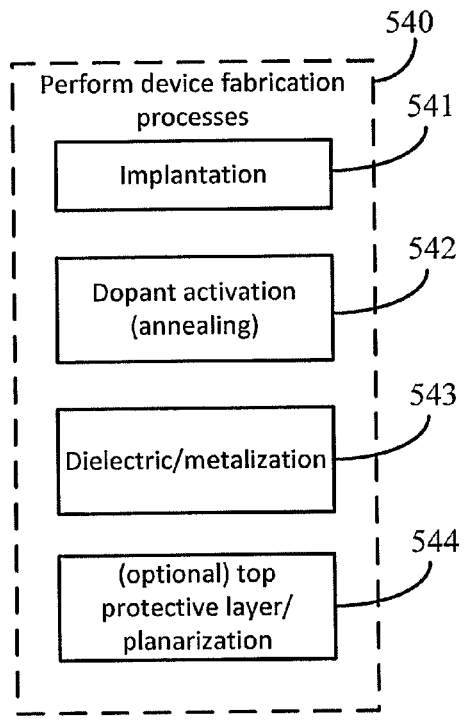
Figure 10D:
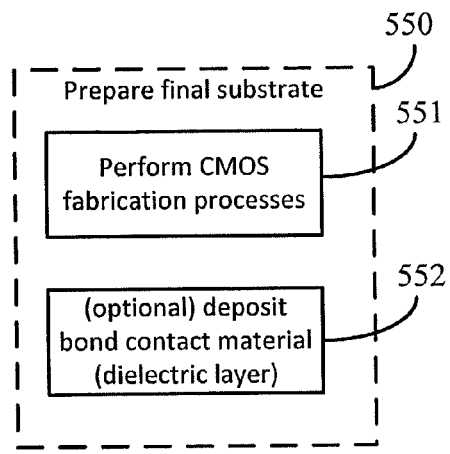

Then, device fabrication processes can be performed (540). Referring to FIG. 10C, these fabrication steps (540) can include doping implants (541), thermal activation (542), dielectrics and metallization (543), associated lithography processes and the like. In addition, the surface (after metallization) can be coated with a spin-on-glass and planarized by CMP if needed (544).

Once fabrication of devices in the SiC is completed, the SiC wafer can be considered complete and/or back-side metallization may be performed. In some cases, the SiC wafer may be bonded to a final substrate (545). The final substrate can be prepared (550). For example, referring to FIG. 10D, the final substrate can be prepared by performing CMOS fabrication processes on a Si wafer (551). Optionally, bond contact material can be deposited to facilitate bonding between the SiC device structure and the Si wafer (552). Returning to FIG. 5, once the final substrate is prepared, it can be provided for bonding to the SiC structure (553).

Figure 6:
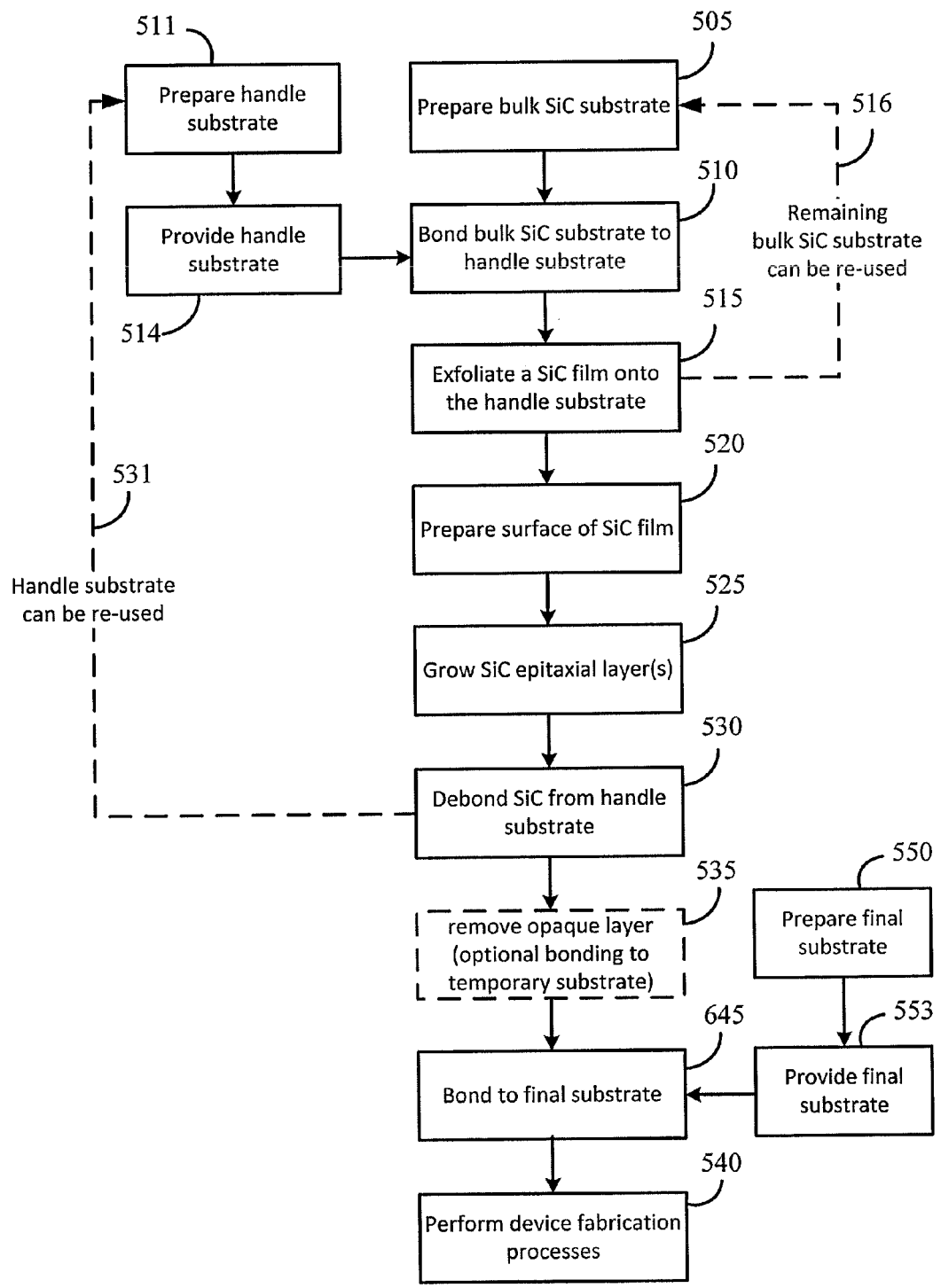
FIG. 6 shows a second process flow diagram for fabricating SiC devices via a thin epitaxial silicon carbide wafer fabrication process.

In the process flow illustrated in FIG. 6, a similar method for fabricating SiC devices via thin epitaxial silicon carbide wafer fabrication processes may be utilized. For example, a bulk SiC substrate may be prepared (505) and bonded to a handle substrate (510) that may be separately prepared (511) and then provided for bonding (514). After bonding, a thin (~1 μm) layer of SiC can be exfoliated onto the handle substrate (515), and the remaining bulk SiC substrate can be reused (516). For the handle substrate with exfoliated SiC layer, the surface of the SiC film can be prepared for subsequent SiC epitaxial growth (520) and the SiC epitaxial layers can be grown on the seed layer formed of the exfoliated SiC film (525). After epitaxial SiC growth, the handle substrate can be debonded (530) and reused (531). In addition, any opaque layer(s) used in the debonding process may be removed (and temporary handle substrates attached and removed) (535).

Unlike in the process described with respect to FIG. 5, in the process illustrated in FIG. 6, the epitaxial wafer is bonded to the final substrate (645) before performing device fabrication processes (540). That is, the final substrate is prepared (550) and provided for bonding to the SiC wafer (553) during the bonding process (645), and then device fabrication processes are performed to form SiC devices on the epitaxial SiC (540).

Figure 8:
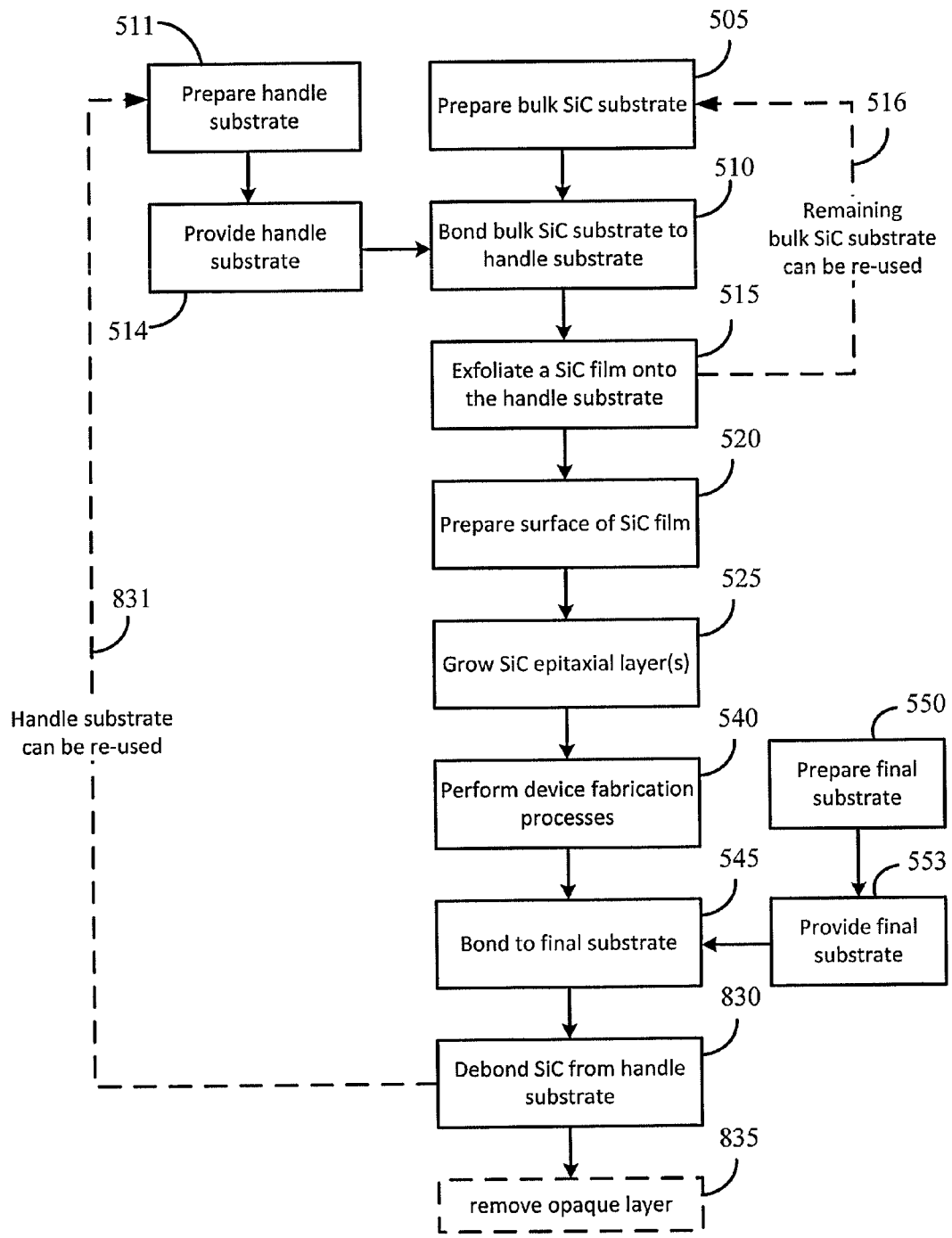
FIG. 8 shows a fourth process flow diagram for fabricating SiC devices via a thin epitaxial silicon carbide wafer fabrication process.
Figure 9:
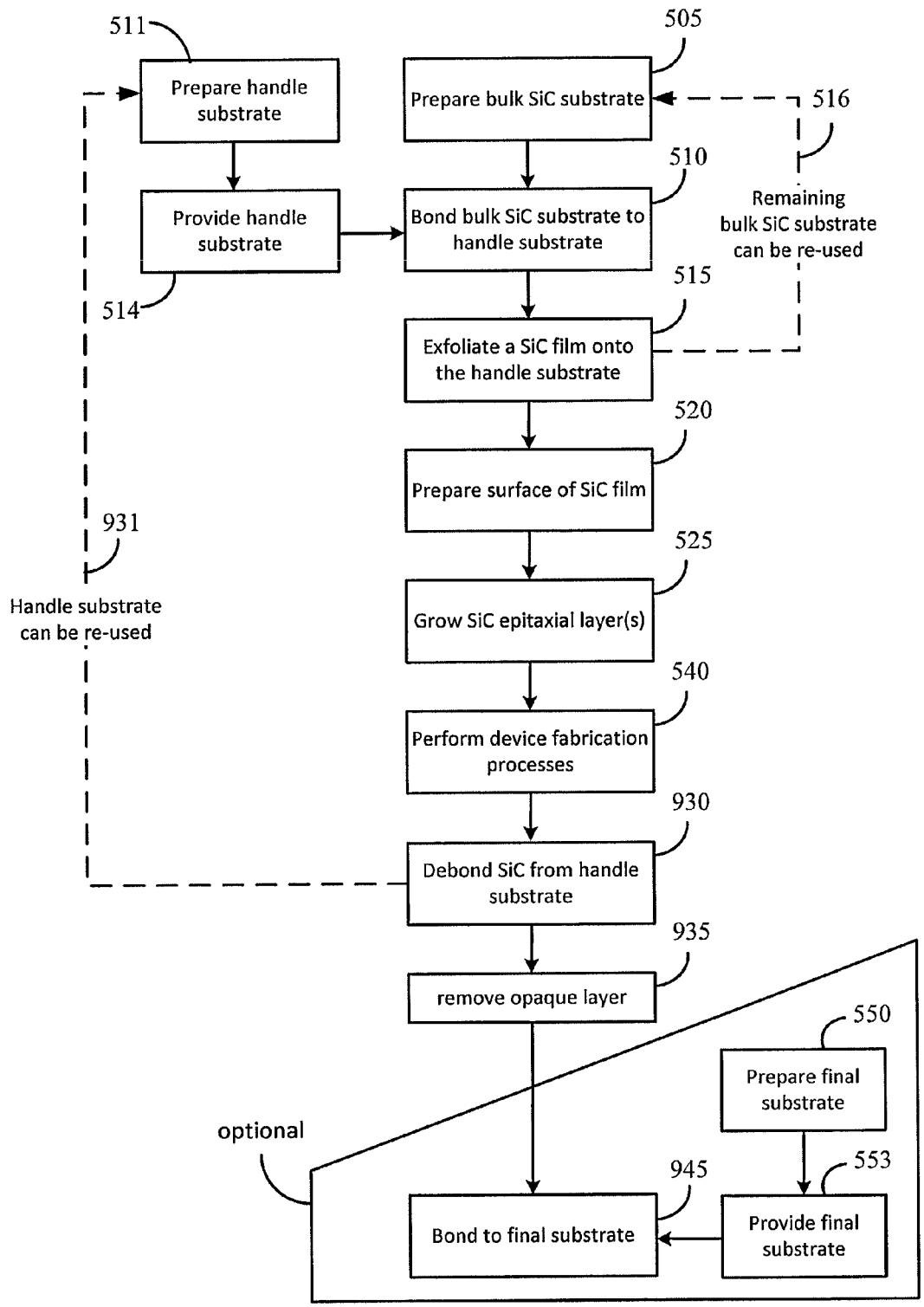
FIG. 9 shows a fifth process flow diagram for fabricating SiC devices via a thin epitaxial silicon carbide wafer fabrication process.

In the process flows illustrated in FIGS. 7, 8, and 9, once the epitaxial SiC layers are formed, front side device fabrication can be carried out (540). Then, various permutations of subsequent steps may be carried out.

Referring to FIG. 7, a bulk SiC substrate may be prepared (505) and bonded to a handle substrate (510) that may be separately prepared (511) and then provided for bonding (514). After bonding, a thin (~1 μm) layer of SiC can be exfoliated onto the handle substrate (515), and the remaining bulk SiC substrate can be reused (516). For the handle substrate with exfoliated SiC layer, the surface of the SiC film can be prepared for subsequent SiC epitaxial growth (520) and the SiC epitaxial layers can be grown on the seed layer formed of the exfoliated SiC film (525).

Unlike in the previously described processes, in the process illustrated in FIG. 7, devices can be fabricated (540) during and/or immediately after growing the epitaxial SiC. Once the devices fabrication process is complete, in operation 710, the SiC can be bonded to a temporary rigid handle substrate coated with a sticky polymer for bonding, and allowing a subsequent debonding at a few 100s C. The handle substrate can then be debonded from the exfoliated SiC layer side (730) and the handle reused (731). In addition, any opaque layer(s) used in the debonding process may be removed (735). In some of such cases, the temporary substrate may remain to facilitate the removal of the opaque material. In some cases, back-side metalization may be formed before the SiC wafer is bonded to the final substrate. The final substrate may be prepared (550) and provided for bonding to the SiC wafer (553).

Referring to FIG. 8, a bulk SiC substrate may be prepared (505) and bonded to a handle substrate (510) that may be separately prepared (511) and then provided for bonding (514). After bonding, a thin (~1 μm) layer of SiC can be exfoliated onto the handle substrate (515), and the remaining bulk SiC substrate can be reused (516). For the handle substrate with exfoliated SiC layer, the surface of the SiC film can be prepared for subsequent SiC epitaxial growth (520) and the SiC epitaxial layers can be grown on the seed layer formed of the exfoliated SiC film (525). Similar to the process illustrated in FIG. 7, devices can be fabricated (540) during and/or immediately after growing the epitaxial SiC.

In the process illustrated in FIG. 8, once the devices fabrication process is complete, the SiC can be bonded to a final substrate (545) that is prepared (550) and provided for bonding (553). Different from the previously described processes, the final substrate is bonded to the front side of the epitaxial SiC wafer and it is after the bonding of the final substrate to the SiC wafer that the handle is debonded from the SiC (830). The handle substrate can then be reused (831). Any opaque layer(s) used in the debonding process may be removed (835).

Referring to FIG. 9, a bulk SiC substrate may be prepared (505) and bonded to a handle substrate (510) that may be separately prepared (511) and then provided for bonding (514). After bonding, a thin (~1 μm) layer of SiC can be exfoliated onto the handle substrate (515), and the remaining bulk SiC substrate can be reused (516). For the handle substrate with exfoliated SiC layer, the surface of the SiC film can be prepared for subsequent SiC epitaxial growth (520) and the SiC epitaxial layers can be grown on the seed layer formed of the exfoliated SiC film (525). Similar to the process illustrated in FIGS. 7 and 8, devices can be fabricated (540) during and/or immediately after growing the epitaxial SiC (525).

Then, in the process illustrated in FIG. 9, once the devices fabrication process is complete, the handle substrate can be debonded (930) and reused (931). The opaque layer used in the debonding process may be removed (935) leaving a completed SiC device wafer. In some implementations, the completed SiC device wafer may be bonded to a final substrate (945) that is prepared (550) and provided for bonding (553).

In various implementations, the epitaxial SiC (device) wafer can be cut into dies that are ready for mounting into packages once the devices are fabricated on the epitaxial wafer. When attached to another substrate, the bonding to the final substrate may occur before or after dicing the wafer into dies and/or chips.

Any elements or limitations of any invention or embodiment thereof disclosed herein can be combined with any and/or all other elements or limitations (individually or in any combination) or any other invention, implementation, or embodiment thereof disclosed herein, and all such combinations are contemplated with the scope of the invention without limitation thereto. It should be understood that the examples and embodiments described herein are for illustrative purposes only and that various modifications or changes in light thereof will be suggested to persons skilled in the art and are to be included within the spirit and purview of this application.

I claim:

1. A method of fabricating thin epitaxial SiC device wafers comprising:
    bonding a bulk SiC wafer consisting of single crystal silicon carbide to a first substrate to form a bonded bulk SiC wafer and first substrate;
    performing an exfoliation process to the bonded bulk SiC wafer and first substrate such that a first portion of the bulk SiC wafer remains on the first substrate as a seed layer and a second portion of the bulk SiC is separated;
    after separation, processing the second portion of the bulk SiC for subsequent bonding to a second substrate;
    growing epitaxial SiC on a Si-face of the seed layer remaining on the first substrate after the exfoliation process that separated the seed layer and the second portion of the bulk SiC; and
    debonding the first substrate from the epitaxial SiC to provide a stand-alone thin epitaxial SiC device wafer, wherein the thin epitaxial SiC device wafer has a thickness of 30-150 μm.

2. The method of claim 1, wherein the first substrate comprises a GaN layer on sapphire substrate.

3. The method of claim 2, wherein debonding the first substrate from the epitaxial SiC comprises performing a laser liftoff to remove the sapphire substrate from the GaN layer.

4. The method of claim 3, further comprising removing the GaN layer from the epitaxial SiC.

5. The method of claim 1, wherein the first substrate comprises a SiC wafer.

6. The method of claim 5, wherein the first substrate further comprises an opaque layer on the SiC wafer.

7. The method of claim 6, wherein the opaque layer comprises InGaN.

8. The method of claim 1, further comprising fabricating devices on a front side of the epitaxial SiC.

9. The method of claim 8, wherein the devices are fabricated before debonding the first substrate from the epitaxial SiC.

10. The method of claim 8, wherein the devices are fabricated after debonding the first substrate from the epitaxial SiC.

11. The method of claim 8, further comprising performing back side metallization on a back side of the epitaxial SiC.

12. The method of claim 1, further comprising bonding the epitaxial SiC to a complementary metal oxide semiconductor (CMOS) substrate.

13. The method of claim 1, further comprising, after debonding the first substrate from the epitaxial SiC, processing the portion of the first substrate to form the second substrate.

14. A method of fabricating thin epitaxial SiC device wafers comprising:
    bonding a bulk SiC wafer consisting of single crystal silicon carbide to a first substrate to form a bonded bulk SiC wafer and first substrate;
    performing an exfoliation process to the bonded bulk SiC wafer and first substrate such that a first portion of the bulk SiC wafer remains on the first substrate as a seed layer and a second portion of the bulk SiC is separated;
    growing epitaxial SiC on a Si-face of the seed layer remaining on the first substrate after the exfoliation process that separated the seed layer and the second portion of the bulk SiC;
    fabricating devices on a front side of the epitaxial SiC; and
    debonding the first substrate from the epitaxial SiC to provide a stand-alone thin epitaxial SiC device wafer, wherein the thin epitaxial SiC device wafer has a thickness of 30-150 μm.

15. The method of claim 14, wherein the devices are fabricated before debonding the first substrate from the epitaxial SiC.

16. The method of claim 14, wherein the devices are fabricated after debonding the first substrate from the epitaxial SiC.

17. A method of fabricating thin epitaxial SiC device wafers comprising:
    preparing a bulk SiC substrate consisting of single crystal silicon carbide for exfoliation of a donation layer;
    preparing a handle substrate by depositing support and/or bonding material;
    bonding the bulk SiC substrate to the handle substrate such that the donation layer faces the support and/or bonding material;
    performing an exfoliation process such that the donation layer remains on the support and/or bonding material and a remaining portion of the bulk SiC is separated;
    growing epitaxial SiC on a Si-face of the donation layer to form a thin epitaxial SiC wafer remaining on the handle substrate after the exfoliation process that separates the donation layer from the remaining portion of the bulk SiC, wherein the thin epitaxial SiC wafer has a thickness of 30-150 μm;
    forming SiC devices on the thin epitaxial SiC wafer;
    performing a laser liftoff process to remove the handle substrate from the thin epitaxial SiC wafer; and
    removing the support and/or bonding material.

18. The method of claim 17, further comprising preparing the remaining portion for exfoliation of another donation layer, the bulk SiC substrate being used for exfoliation of a plurality of donation layers for subsequently fabricated epitaxial SiC device wafers.

19. The method of claim 17, wherein the handle substrate comprises sapphire or SiC.

20. The method of claim 17, further comprising implanting p-type dopants to the donation layer, wherein growing the epitaxial SiC comprises growing p-type SiC on the donation layer.

21. The method of claim 17, further comprising implanting n-type dopants to the donation layer, wherein growing the epitaxial SiC comprises growing n-type SiC on the donation layer.

* * * * *